United States Patent
Yamaguchi et al.

(10) Patent No.: US 6,480,503 B1
(45) Date of Patent: Nov. 12, 2002

(54) TURBO-COUPLED MULTI-CODE MULTIPLEX DATA TRANSMISSION FOR CDMA

(75) Inventors: Hirohisa Yamaguchi, Ibaraki (JP); Mitsuhiko Yagyu, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/259,692

(22) Filed: Mar. 1, 1999

Related U.S. Application Data
(60) Provisional application No. 60/113,914, filed on Dec. 28, 1998.

(51) Int. Cl.⁷ .............................................. H04B 7/216
(52) U.S. Cl. ........................................ 370/441; 370/342
(58) Field of Search ................................ 370/441, 203, 370/204, 205, 206, 208, 209, 335, 342, 491, 514, 515, 320; 375/130, 132, 135, 136, 140, 142, 143, 146, 147, 150, 152, 239, 261, 262, 269, 298, 308, 329, 367, 267, 299, 347; 714/755, 756, 795

(56) References Cited

U.S. PATENT DOCUMENTS

| | | | |
|---|---|---|---|
| 5,228,054 A | | 7/1993 | Rueth et al. .................... 375/1 |
| 5,596,601 A | * | 1/1997 | Bar-David .................. 375/143 |
| 5,777,990 A | * | 7/1998 | Zehavi et al. ............... 370/335 |
| 5,784,366 A | * | 7/1998 | Apelewicz .................. 370/340 |
| 5,983,385 A | * | 11/1999 | Khayrallah et al. ......... 714/755 |
| 5,996,104 A | * | 11/1999 | Herzberg .................... 714/755 |
| 6,023,783 A | * | 2/2000 | Divsalar ..................... 714/792 |
| 6,088,387 A | * | 7/2000 | Gelblum et al. ............ 375/222 |
| 6,192,503 B1 | * | 2/2001 | Chennakeshu et al. ..... 714/796 |

OTHER PUBLICATIONS

"Report On FPLMTS Radio Transmission Technology Special Group", (Round 2 Activity Report), *Association of Radio Industries and Business (ARIB)*, FPLMTS Study Committee, Draft Version E1.1, Jan. 10, 1997, 224 pages.

"Prosposed Wideband CDMA (W–CDMA)", *Association of Radio Industries and Businesses (ARIB)*, Japan, 01/97, 213 pages.

Iterative Decoding of Binary Block and Convolutional Codes, Hagenauer, et al., *IEEE Transactions on Information Theory*, vol. 42, No. 2, 03/96, pp. 429–445.

"Near Optimum Error correcting Coding and Decoding: Turbo–Codes," Berrou, et. al., *IEEE Transactions on Communications*, vol. 44, No. 10, 10/96 pp. 1261–1271.

* cited by examiner

*Primary Examiner*—Douglas Olms
*Assistant Examiner*—Phirin Sam
(74) *Attorney, Agent, or Firm*—Robert N. Rountree; Wade James Brady, III; Frederick J. Telecky, Jr.

(57) ABSTRACT

A circuit is designed with an encoder circuit (602) coupled to receive a data sequence. The encoder circuit produces a first encoded data sequence and a second encoded data sequence from the data sequence. A first spreading circuit (606) is coupled to receive the data sequence and the first encoded data sequence. The first spreading circuit produces a first modulated data sequence in response to a first code. A second spreading circuit (614) is coupled to receive the data sequence and the second encoded data sequence. The second spreading circuit produces a second modulated data sequence in response to a second code.

22 Claims, 5 Drawing Sheets

TURBO-COUPLED MULTI-CODE MULTIPLEX DATA TRANSMISSION FOR CDMA

This amendment claims priority under 35 USC §119(e)(1) of provisional application No. 60/113,914, filed Dec. 28, 1998.

FIELD OF THE INVENTION

This invention relates to wideband code division multiple access (WCDMA) for a communication system and more particularly to turbo-coupled multi-code multiplex data transmission for WCDMA signals.

BACKGROUND OF THE INVENTION

New standards are continually emerging for next generation wideband code division multiple access (WCDMA) communication. These WCDMA systems are coherent communication systems with pilot symbol assisted channel estimation schemes. These pilot symbols are transmitted as quadrature phase shift keyed (QPSK) known data in predetermined time frames to any receivers within range. The frames may propagate in a discontinuous transmission (DTX) mode. For voice traffic, transmission of user data occurs when the user speaks, but no data symbol transmission occurs when the user is silent. Similarly for packet data, the user data may be transmitted only when packets are ready to be sent. The frames are subdivided into sixteen equal time slots of 0.625 milliseconds each. Each time slot is further subdivided into equal symbol times. At a data rate of 32 KSPS, for example, each time slot includes twenty symbol times. Each frame includes pilot symbols as well as other control symbols such as transmit power control (TPC) symbols and rate information (RI) symbols. Each symbol includes I and Q bits corresponding to real and imaginary parts of a QPSK signal. The symbols are subdivided or spread into smaller signal units called chips. Each bit is typically spread over 16 to 256 chips according to a predetermined spreading rate. A pseudorandom noise (PN) generator generates each group of spreading chips. The initial state of this PN generator determines the spreading code of the chips. The chip transmission time ($T_C$), therefore, is equal to the symbol time rate (T) divided by the number of chips (N) that spread the symbol.

Present code division multiple access (CDMA) systems are characterized by simultaneous transmission of different data signals over a common channel by assigning each signal a unique code. This unique code is matched with a code of a selected receiver to determine the proper recipient of a data signal. These different data signals arrive at the receiver via multiple paths due to ground clutter and unpredictable signal reflection. Additive effects of these multiple data signals at the receiver may result in significant fading or variation in received signal strength. In general, this fading due to multiple data paths may be diminished by spreading the transmitted energy over a wide bandwidth. This wide bandwidth results in greatly reduced fading compared to narrow band transmission modes such as frequency division multiple access (FDMA) or time division multiple access (TDMA).

Referring to FIG. 4, this spreading of data signals over a wide bandwidth is accomplished by encoding a data sequence $D_k$ on lead 100, for example, by a recursive systematic convolutional (RSC) encoder 400. The encoded data sequence on lead 402 is modulated by a CDMA spreading code by circuit 404. This M-sequence or Gold code is typically produced by a linear feedback shift register (LFSR) circuit such as the forward link LFSR of FIG. 3. The first LFSR 300 circuit is preferably initialized to a characteristic state of the base station. The second LFSR 310 is preferably initialized to an all-one state. The sequence of each LFSR circuit is typically defined by an LFSR polynomial. This polynomial is characterized by the number of shift register bits and the location of feedback taps such as feedback tap 304 of LFSR 300.

Previous studies have investigated turbo-code systems for improved transmission power in CDMA systems. In their paper, Claude Berrou et al., *Near Optimum Error Correcting Coding and Decoding: Turbo-Codes,* IEEE Trans. on Commun., vol. 44, no. 10, October 1996, at 1261, compare recursive systematic convolutional (RSC) codes to nonsystematic convolutional (NSC) codes. Referring to FIG. 10, there is an exemplary NSC encoder of the prior art. This NSC encoder receives an input bit X0 on lead 1000 and generates three output bits Y0, Y1 and Y2 on leads 1030, 1031 and 1032, respectively, for an R=1/3 transmission rate and constraint a length of 9. Series-connected register stages 1010 through 1017 sequentially shift input bit X0 through each stage in response to a clock signal (not shown). Input signal X0 and output signals from the eight register stages, therefore, influence output bits Y0, Y1 and Y2 for 9 clock periods. This finite period of influence permits use of a maximum likelihood finite-state decoder such as the Viterbi decoder.

By way of comparison, FIG. 11 is an exemplary RSC encoder of the prior art. The RSC encoder receives an input bit $X_k$ on lead 1100 and produces the systematic output bit $X_k$ together with parity bit $Y_k$ on lead 1126. This RSC encoder includes a feedback shift register with series-connected stages 1110 through 1113, which continually feed back the input signal via sum circuits 1130, 1132, 1134 and 1120. Thus, input bit $X_k$ influences the generation of parity bit $Y_k$ for the entire encoding period. This expanded influence results in improved performance approaching the Shannon theoretical limit when used with a maximum likelihood Viterbi decoder.

Berrou et al. describe an exemplary RSC encoder having a transmission rate R=1/2 as in FIG. 1. This exemplary encoder 102 receives a data sequence $D_k$ on lead 100. The RSC encoder 102 produces a coded data bit $X_k$ and a redundant or parity bit $Y_k$ on lead 104. Berrou et al. further disclose a turbo-code RSC encoder (FIG. 2) including a first RSC encoder 200 and a second RSC encoder 210. The turbo-code interleaver circuit 206 typically comprises a matrix that receives data in row order and produces the data in column order to achieve maximum scattering of data and maximum disorder of the interleaved data. Berrou et al. state that the data may be completely transmitted for a rate R=1/3 encoding or punctured for higher rates. Id. at 1263. This punctured data transmission is accomplished by alternately multiplexing the output from RSC encoders 200 and 210 onto lead 214 with multiplex circuit 204. Thus the order of transmitted data is given by equations [1–2].

$$X_k = X_n \to X_{n+1} \to X_{n+2} \to X_{n+3} \ldots \qquad [1]$$

$$Y_k = Y_n{}^2 \to Y_{n+1}{}^1 \to Y_{n+2}{}^2 \to Y_{n+3}{}^1 \ldots \qquad [2]$$

Although the RSC turbo-code achieves efficiency near the Shannon limit, it must rely on puncturing to accomplish this end. This use of puncturing, however, fails to use an appreciable amount of available information.

SUMMARY OF THE INVENTION

The foregoing problems are resolved by a circuit designed with an encoder circuit coupled to receive a data sequence.

The encoder circuit produces a first encoded data sequence and a second encoded data sequence from the data sequence. A first spreading circuit is coupled to receive the data sequence and the first encoded data sequence. The first spreading circuit produces a first modulated data sequence in response to a first code. A second spreading circuit is coupled to receive the data sequence and the second encoded data sequence. The second spreading circuit produces a second modulated data sequence in response to a second code.

The present invention improves transmission power by turbo-coupled multi-code multiplexing. No increase in coding rate is required. Communication is improved by controlling transmission power of redundant information without puncturing.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 7:
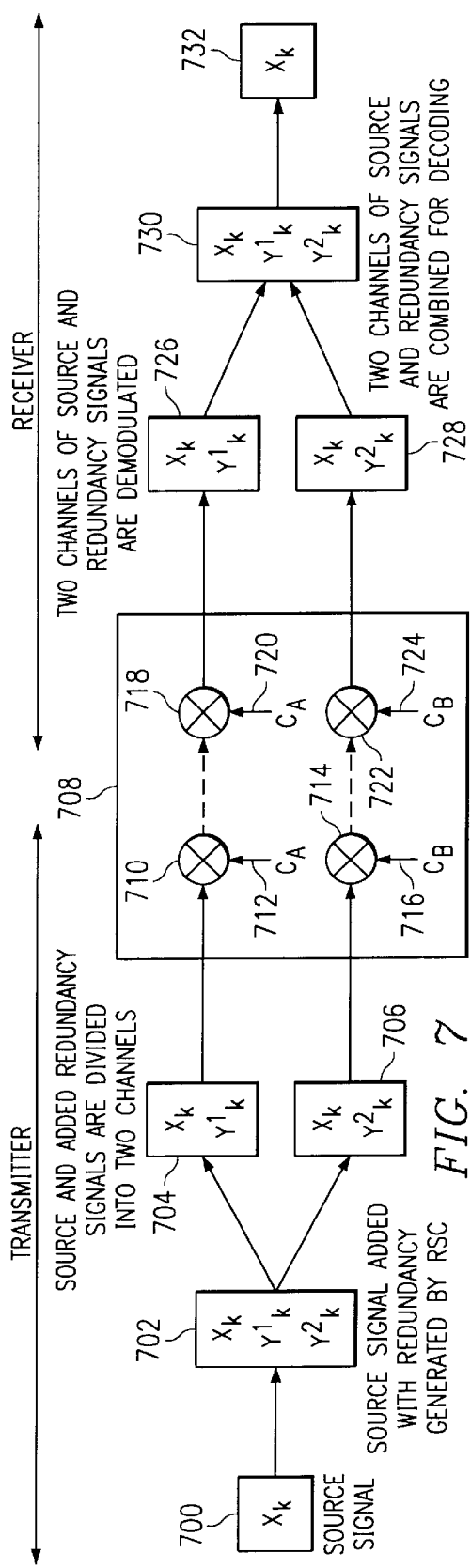
FIG. 7 is a simplified block diagram of signal flow from transmitter to receiver by turbo-coupled multi-code multiplexing of the present invention.

Referring now to FIG. 7, there is a block diagram showing signal flow from transmitter to receiver by turbo-coupled multi-code multiplexing (TMM) of the present invention. The transmitter signal flow path begins with source signal sequence $X_k$ 700. An RSC encoder circuit receives the source sequence and produces parity bit sequences $Y_k^1$ and $Y_k^2$ at block 702. The source and parity sequences are divided into separate channels corresponding to blocks 704 and 706, respectively. One channel with sequences $X_k$ and $Y_k^1$ is modulated by circuit 710 with spreading code $C_A$ on lead 712. The other channel with sequences $X_k$ and $Y_k^2$ is modulated by circuit 714 with spreading code $C_B$ on lead 716. These data sequences are then transmitted to a remote receiver and demodulated by despreader circuits 718 and 724 with respective orthogonal spreading codes $C_A$ and $C_B$ on leads 720 and 724 as will be explained in detail. Data sequences from the separate channels are relayed to an RSC decoder 730 by blocks 726 and 728. The RSC decoder, shown in detail at FIG. 8, reproduce the source signal sequence at the receiver block 732.

Figure 5:
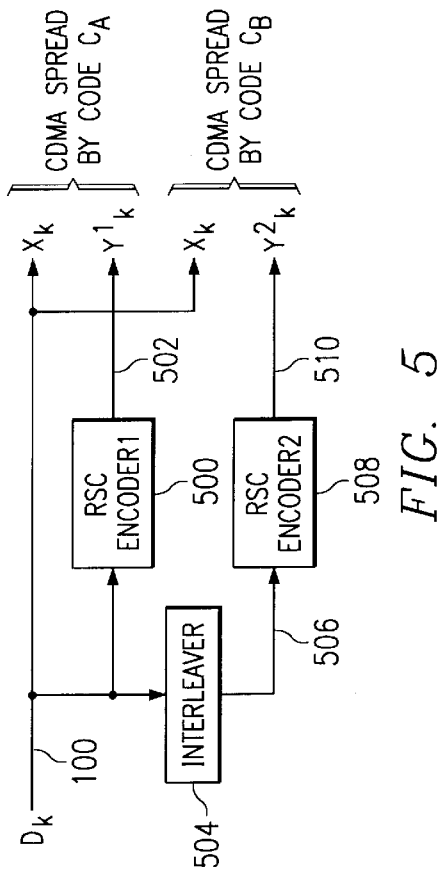
FIG. 5 is a block diagram of the RSC encoder 602 of FIG. 6.

Referring now to FIG. 5, there is a block diagram showing parity bit encoding by TMM corresponding to block 702 of the present invention. The encoder circuit is coupled to receive a data sequence $D_k$ on lead 100. This data is produced as output data sequence $X_k$. The RSC encoder circuit 500 receives the data sequence and produces a first encoded data sequence $Y_k^1$ on lead 502 in response to a first code. An interleaver circuit 504 preferably stores the data sequence $D_k$ in an M×M matrix by rows and produces the data by columns on lead 506. A second RSC encoder circuit 508 receives the data sequence on lead 506 and produces a second encoded data sequence $Y_k^2$ on lead 510 in response to a second code.

Figure 8:
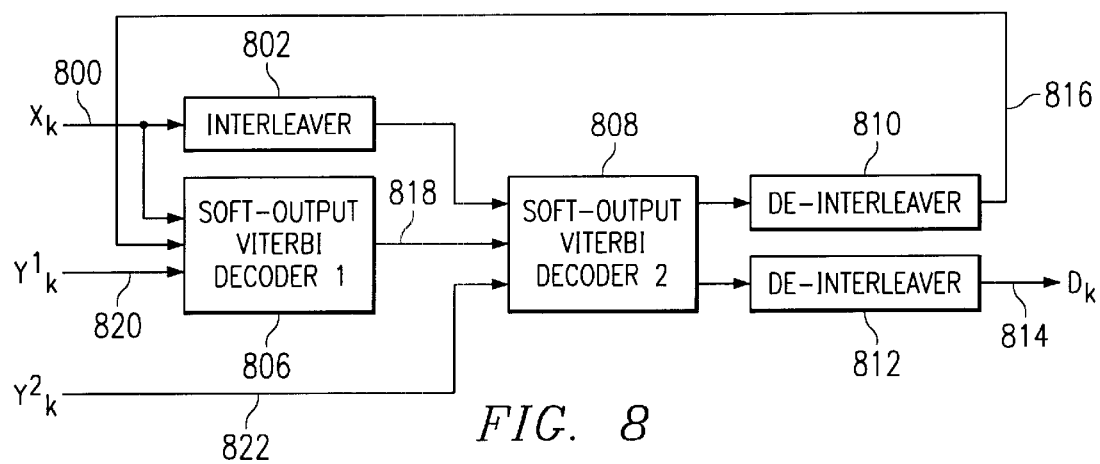
FIG. 8 is a block diagram of the RSC decoder 644 of FIG. 6.

The block diagram of FIG. 8 shows a TMM decoding circuit corresponding to block 730 (FIG. 7). This decoding circuit is similar to the turbo decoder of Berrou et al., except that input data from each channel are presented in parallel. The RSC decoder circuit is coupled to receive input sequence $X_k$ on lead 800 and parity input sequences $Y_k^1$ and $Y_k^2$ on leads 820 and 822, respectively. An interleaver circuit 802 restores the data sequence to the order prior to encoding. A first Viterbi decoder 806 receives data sequences $X_k$ and $Y_k^1$ corresponding to the first channel together with likelihood feedback information on lead 816. The first Viterbi decoder 806 produces a likelihood soft output on lead 818. This likelihood soft output is preferably a logarithm of probability that each data bit of the output data sequence is a one or a zero. A second Viterbi decoder 808 receives the second channel data sequences $X_k$ and $Y_k^2$ together with the likelihood information from the first decoder 806. The second Viterbi decoder 808 produces a likelihood soft output that is applied to de-interleaver circuit 812. This de-interleaver circuit corrects the order of data and produces output data sequence $D_k$ on lead 814. A second de-interleaver circuit 810 produces the likelihood feedback signal on lead 816 for subsequent decoding.

Figure 6:
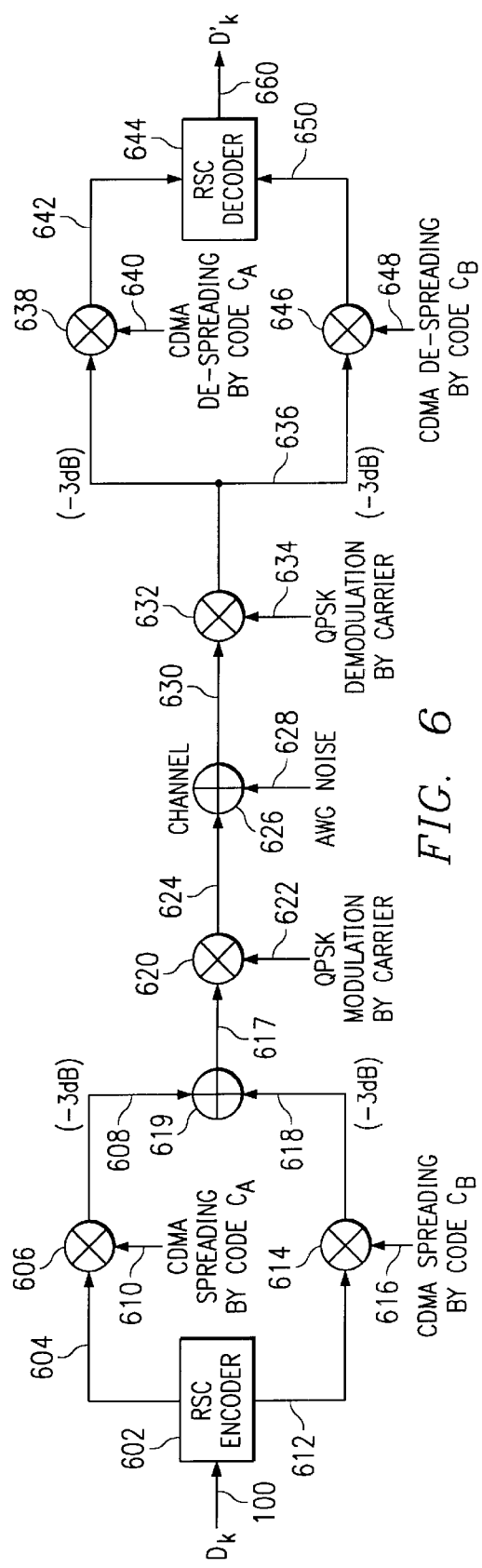
FIG. 6 is a schematic diagram of a transmitter and receiver of the present invention.

Turning to FIG. 6, there is a schematic diagram of a transmitter and receiver of the present invention including the RSC encoder 602 of FIG. 5. The encoder circuit 602 applies the data sequence $D_k$ on lead 100 and the encoded data sequence $Y_k^1$ to spreading circuit 606 via lead 604. The spreading circuit 606 produces respective modulated data sequences on lead 608 in response to CDMA spreading code $C_A$ on lead 610. These modulated data sequences have an amplitude adjusted by preferably −3 dB. The encoder circuit 602 further applies the data sequence $D_k$ and the encoded data sequence $Y_k^2$ to spreading circuit 614 via lead 612. The spreading circuit 614 produces respective modulated data sequences on lead 618 in response to CDMA spreading code $C_B$ on lead 616. These modulated data sequences have an amplitude adjusted by preferably −3 dB. The spreading codes $C_A$ and $C_B$ are orthogonal spreading codes. This use of orthogonal spreading codes is highly advantageous in maintaining the independence of each data sequence. Thus, each data sequence remains independent of the other even after being combined by circuit 619. The sequence of data for each channel $CH_A$ and $CH_B$ on leads 608 and 618, respectively, is given by equations [3–6].

$$CH_A(X_k) = X_n \to X_{n+1} \to X_{n+2} \to X_{n+3} \ldots \quad [3]$$

$$CH_A(Y_k) = Y_n^1 \to Y_{n+1}^1 \to Y_{n+2}^1 \to Y_{n+3}^1 \ldots \quad [4]$$

$$CH_B(X_k) = X_n \to X_{n+1} \to X_{n+2} \to X_{n+3} \ldots \quad [5]$$

$$CH_B(Y_k) = Y_n^2 \to Y_{n+1}^2 \to Y_{n+2}^2 \to Y_{n+3}^2 \ldots \quad [6]$$

The combined data sequences on lead 617 are applied to modulation circuit 620 for QPSK modulation by the carrier. The signal is then transmitted by a transmitting antenna (not shown) to a remote mobile system. Transmission effects of this signal on lead 624 are represented by addition of additive white Gussian noise on lead 628 (AWGN) by circuit 626.

A mobile station receives the transmitted signal by a receiving antenna (not shown) on lead 630 and demodulates the QPSK signal with the carrier at lead 634. The QPSK demodulator 632 produces data sequences modulated by CDMA spreading codes $C_A$ and $C_B$ on lead 636. These modulated sequences maintain a −3 dB gain adjustment corresponding to the transmitted signal. These data sequences are applied to despreading circuits 638 and 646 where they are demodulated by respective CDMA spreading codes $C_A$ and $C_B$ on leads 640 and 648. The resulting encoded data sequences on leads 642 and 650 are applied to RSC decoder 644. The RSC decoder 644, shown in detail at FIG. 8, produces decoded data sequence $D_k'$ on lead 660. This resulting baseband signal can be represented as $S_k+n(t)$, where $S_k$ is one of the systemic data signals $X_k$ or one of the parity data signals $Y_k^1$ or $Y_k^2$ and n(t) corresponds to AWGN. Due to the independence of the orthogonal spreading codes, energy of the noise contribution, as represented by equation [7], is negligible.

$$E\{\int n(t)C_A(t)dt \int n(s)C_B(s)ds\}=\sigma_N^2 \int C_A(t)C_B(t)dt=0 \quad [7]$$

Other highly advantageous aspects of the present invention include the benefits of a high data rate and a low coding rate. Although the output rate of encoder 602 is R=1/3, the coding rate of each channel $CH_A$ and $CH_B$ is R=1/2. Moreover, the gain of systematic data sequence $X_k$ on lead 660 is increased to 0 dB due to the additive effect of the RSC decoder 644. Parity data signals, however, advantageously remain at −3 dB. Transmission power according to the present invention, therefore, is the same as systems of the prior art using puncturing. Communication is improved by controlling transmission power of redundant or parity data. Moreover, unlike punctured sequences, both parity sequences are advantageously transmitted at the same time together with the systematic data sequence to improve decoding.

Figure 1:
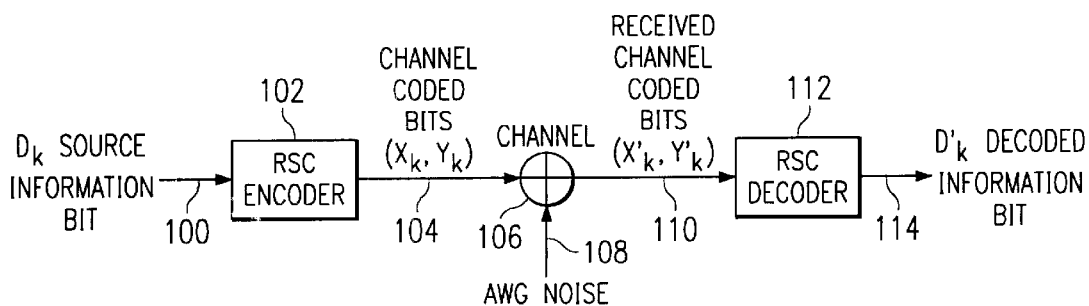
FIG. 1 is a simplified block diagram of a typical transmitter and receiver of the prior art.
Figure 2:
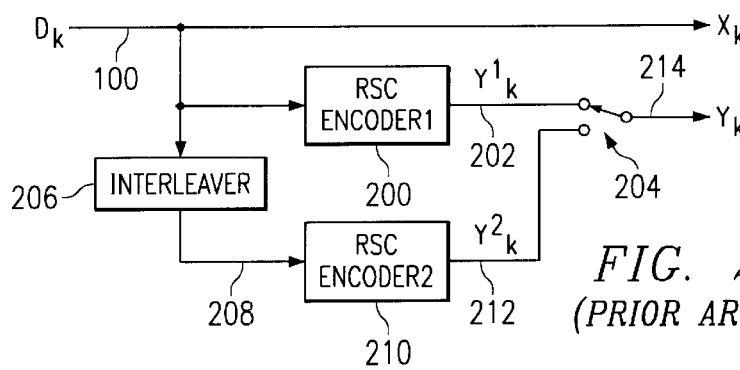
FIG. 2 is a block diagram showing parity bit encoding of the prior art by puncturing.
Figure 3:
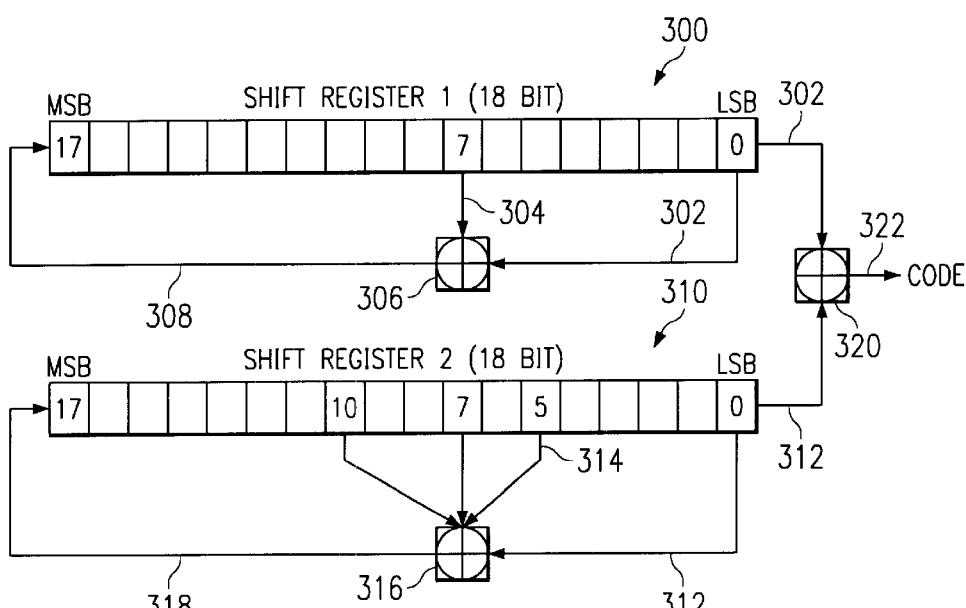
FIG. 3 is a schematic diagram of a linear feedback shift register of the prior art for generating long code sequences.
Figure 4:
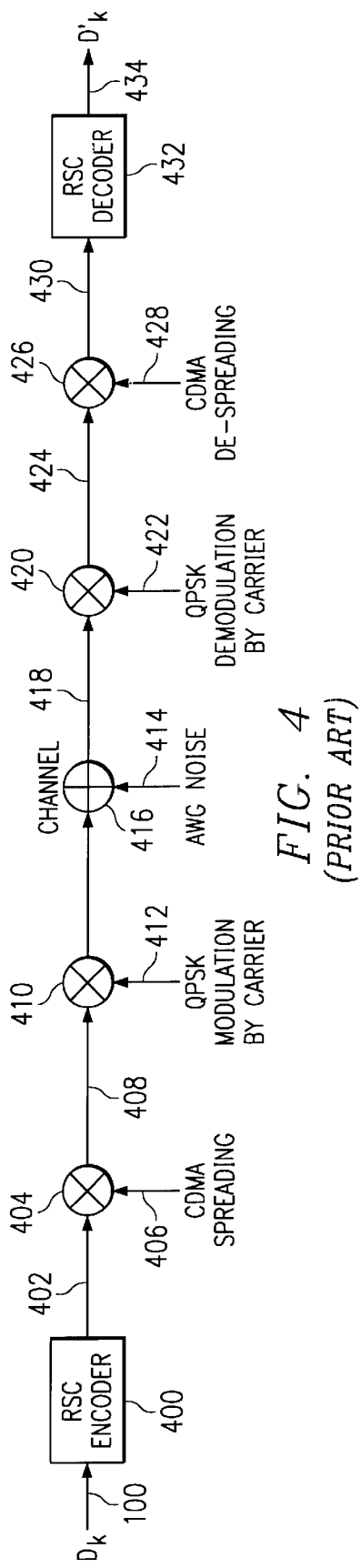
FIG. 4 is a block diagram of a typical transmitter and receiver of the prior art.
Figure 9:
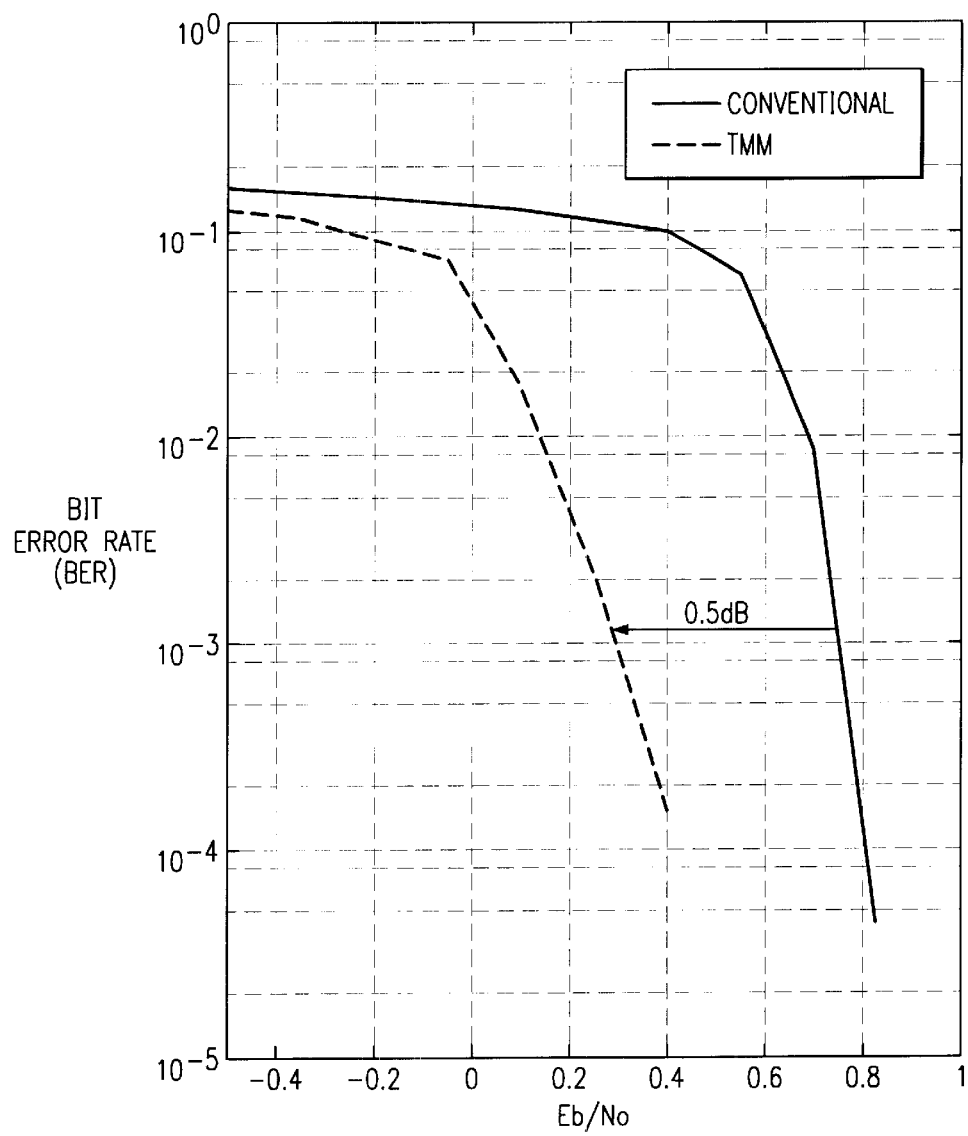
FIG. 9 is a simulation result comparing the circuit of FIG. 4 with the circuit of FIG. 6 of the present invention.
Figure 10:
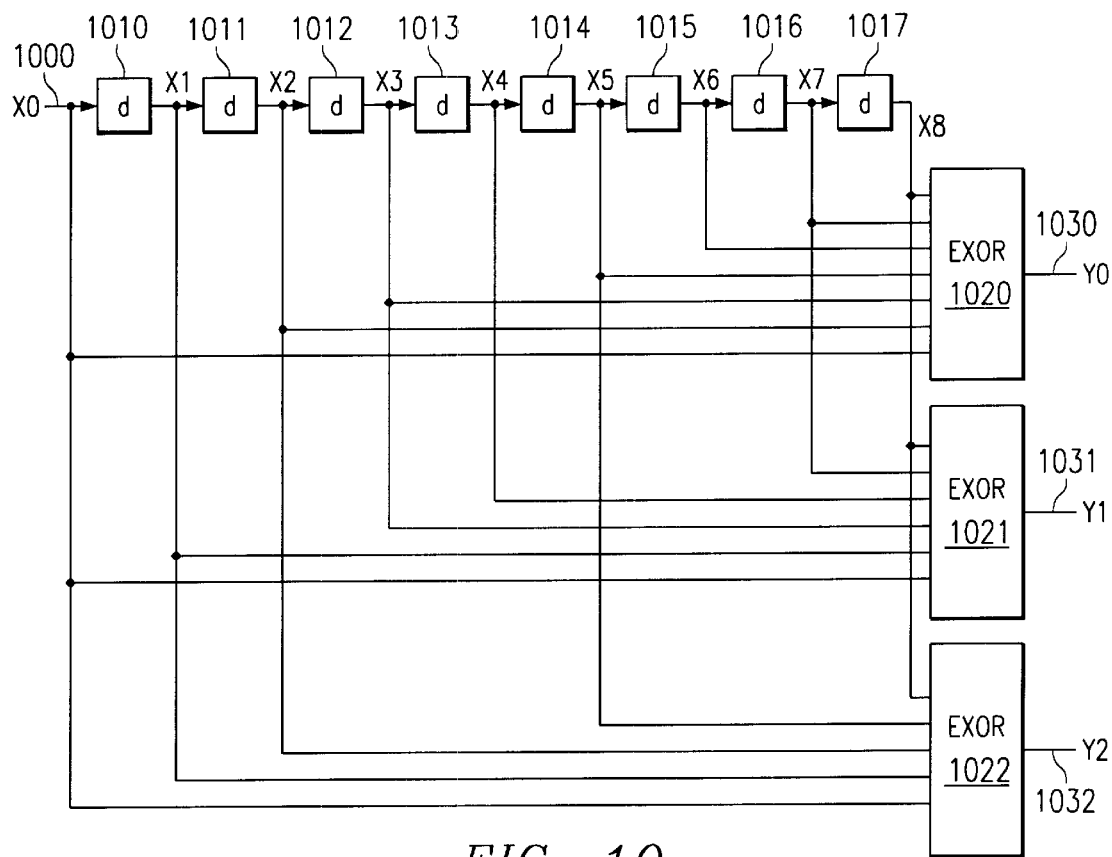
FIG. 10 is a schematic diagram of an NSC encoder of the prior art.
Figure 11:
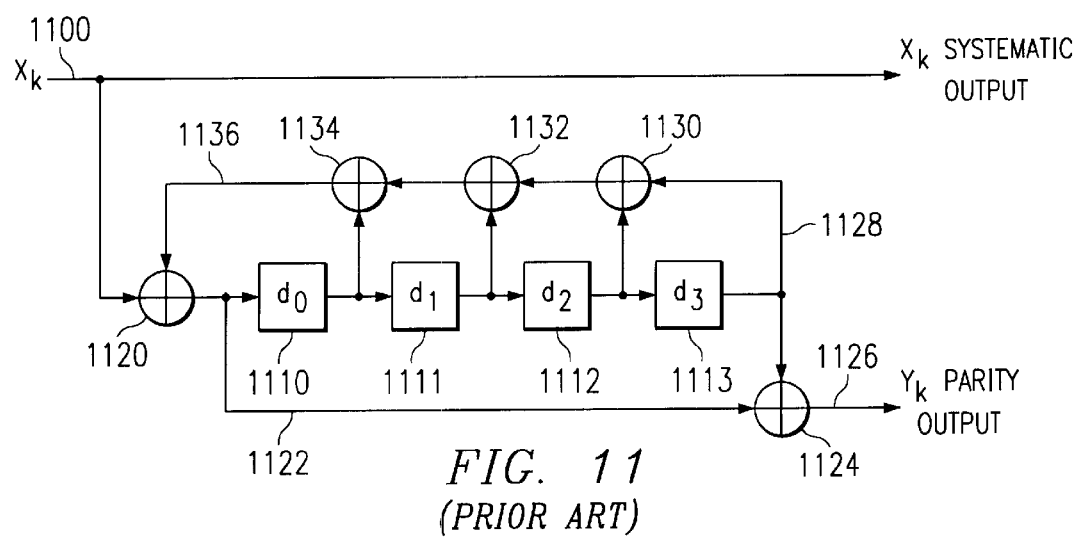
FIG. 11 is a schematic diagram of an RSC encoder of the prior art.

Referring now to FIG. 9, there is a simulation result comparing the circuit of FIG. 4 with the circuit of FIG. 6 of the present invention. The turbo-coupled multi-code multiplex (TMM) simulation of the present invention includes RSC encoder polynomials $G_1$=37 and $G_2$=21 with a 256× 256 interleaving matrix. At a preferable bit error rate (BER) of $10^{-3}$ the TMM curve has a 0.5 dB advantage in bit energy-to-noise (Eb/N0) ratio over the conventional system of FIG. 4. This 0.5 dB advantage of the present invention is consistent for all BER between $10^{-1}$ and $10^{-4}$.

Although the invention has been described in detail with reference to its preferred embodiment, it is to be understood that this description is by way of example only and is not to be construed in a limiting sense. For example, advantages of the present invention may be readily extended to increased multi-code multiplexing. Furthermore, many of the advantages of the present invention may be achieved by a digital signal processing circuit as will be appreciated by those of ordinary skill in the art having access to the instant specification.

It is understood that the inventive concept of the present invention may be embodied in a mobile communication system as well as circuits within the mobile communication system. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
    an encoder circuit coupled to receive a data sequence, the encoder circuit producing a first encoded data sequence and a second encoded data sequence from the data sequence;
    a first spreading circuit coupled to receive the data sequence and the first encoded data sequence, the first spreading circuit producing a first modulated data sequence; and
    a second spreading circuit coupled to receive the data sequence and the second encoded data sequence, the second spreading circuit producing a second modulated data sequence.

2. A circuit as in claim 1, wherein the encoder circuit further comprises:
    a first encoder circuit coupled to receive the data sequence, the first encoder circuit producing the first encoded data sequence in response to a first code; and
    a second encoder circuit coupled to receive the data sequence, the second encoder circuit producing the second encoded data sequence in response to a second code.

3. A circuit as in claim 1, wherein the first modulated data sequence comprises the data sequence and the first encoded data sequence modulated by a third code and wherein the second modulated data sequence comprises the data sequence and the second encoded data sequence modulated by a fourth code.

4. A circuit as in claim 1, wherein each of the first and second modulated data sequences are further modulated by QPSK modulation.

5. A circuit as in claim 4, wherein the data sequences modulated by QPSK modulation are wideband code division multiple access signals.

6. A circuit as in claim 1, wherein the encoder circuit is a recursive systematic convolutional encoder.

7. A circuit, comprising:
    a first despreading circuit coupled to receive a first modulated data sequence at a first time, the first despreading circuit producing a fist encoded data sequence from the first modulated data sequence in response to a fist code;
    a second reading circuit coupled to receive a second modulated data sequence at the first time, the second despreading circuit producing a second encoded data sequence from the second modulated data sequence in response to a second code; and
    a decoder circuit coupled to receive a data sequence, the first encoded data sequence and the second encoded data sequence at a second time, the decoder circuit producing an output data sequence.

8. A circuit as in claim 7, wherein the decoder circuit further comprises:
    a first decoder circuit coupled to receive the data sequence, the first encoded data sequence and a feedback sequence, the first decoder circuit producing a likelihood sequence; and
    a second decoder circuit coupled to receive the data sequence, the second encoded data sequence and the likelihood sequence, the second decoder circuit producing the output data sequence.

9. A circuit as in claim 8, wherein each of the first and second decoder circuits comprises a Viterbi decoder circuit.

10. A circuit as in claim 7, further comprising a QPSK demodulation circuit coupled to receive a wideband code division multiple access signal, the QPSK demodulation circuit producing the first modulated data sequence and the second modulated data sequence.

11. A method of processing a data signal for a communication system comprising the steps of:
   producing a first encoded data signal by encoding the data signal;
   producing a second encoded data signal by encoding the data signal;
   modulating the data signal and the first encoded data signal with a first code;
   modulating the data signal and the second encoded data signal with a second code; and
   transmitting the first and second encoded data signals at a first time.

12. A method of processing a data signal as in claim 11, wherein the first and second codes are orthogonal spreading codes.

13. A method of processing a data signal as in claim 11, further comprising the steps of:
   transmitting the data signal modulated with the first code at the first time; and
   transmuting the data signal modulated with the second code at the fist time.

14. A method of processing a data signal as in claim 11, wherein the data signal comprises a systematic data sequence, the first encoded data signal comprises a first parity sequence, and the second encoded data signal comprises a second parity sequence.

15. A circuit as in claim 1, wherein the first spreading circuit produces the first modulated data sequence in response to a first code and the second spreading circuit produces the second modulated data sequence in response to a second and wherein the first code is different from the second code.

16. A method of processing a data signal as in claim 11, wherein the first code is different from the second code.

17. A method of processing a data signal as in claim 11, wherein the first encoded data signal is encoded with a third code and wherein the second encoded data signal is encoded with a fourth code.

18. A method of processing signals comprising the steps of:
   receiving a data sequence;
   receiving a first parity sequence;
   receiving a second parity sequence, different from the first parity sequence;
   decoding the data sequence and the first parity sequence, thereby producing a first output signal;
   decoding the data sequence and the second parity sequence, thereby producing a second output signal; and
   producing an output data sequence in response to the first and second output signals.

19. A method as in claim 18, comprising the steps of:
   producing a feedback signal in response to the first output signal, the data sequence, and the second parity sequence; and
   decoding the data sequence and the first parity sequence in response to the feedback signal.

20. A method as in claim 18, wherein each of the first and second output signals are likelihood soft output signals.

21. A method as in claim 18, wherein each of the first and second output signals are produced by respective first and second Viterbi decoders.

22. A method as in claim 18, wherein the data sequence is interleaved prior to at least one of the steps of decoding.

* * * * *